United States Patent
Chen et al.

(10) Patent No.: US 10,170,396 B2
(45) Date of Patent: Jan. 1, 2019

(54) THROUGH VIA STRUCTURE EXTENDING TO METALLIZATION LAYER

(71) Applicant: Taiwan Semiconductor Manufacturing Company, Ltd., Hsin-Chu (TW)

(72) Inventors: Yi-Hsiu Chen, Hsinchu (TW); Ku-Feng Yang, Baoshan Township (TW); Wen-Chih Chiou, Zhunan Township (TW); Shin-Puu Jeng, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 152 days.

(21) Appl. No.: 14/284,699

(22) Filed: May 22, 2014

(65) Prior Publication Data
US 2015/0235922 A1 Aug. 20, 2015

Related U.S. Application Data

(60) Provisional application No. 61/940,203, filed on Feb. 14, 2014.

(51) Int. Cl.
| H01L 23/48 | (2006.01) |
| H01L 27/088 | (2006.01) |
| H01L 23/522 | (2006.01) |
| H01L 27/12 | (2006.01) |
| H01L 21/768 | (2006.01) |
| H01L 23/532 | (2006.01) |

(52) U.S. Cl.
CPC ...... H01L 23/481 (2013.01); H01L 21/76898 (2013.01); H01L 23/5226 (2013.01); H01L 23/53295 (2013.01); H01L 27/0886 (2013.01); H01L 27/1211 (2013.01); H01L 21/76832 (2013.01); H01L 23/53223 (2013.01);
(Continued)

(58) Field of Classification Search
CPC ......... H01L 21/76898; H01L 21/76831; H01L 21/76801; H01L 23/481; H01L 23/5226; H01L 23/53295; H01L 27/0886; H01L 27/1211; H01L 23/53223; H01L 23/53238;
(Continued)

(56) References Cited

U.S. PATENT DOCUMENTS

2005/0153505 A1* 7/2005 Gambino .......... H01L 21/76807
438/233
2007/0029611 A1* 2/2007 Phan .................... H01L 21/743
257/347

(Continued)

Primary Examiner — Mohsen Ahmadi
Assistant Examiner — Patricia Reddington
(74) Attorney, Agent, or Firm — Slater Matsil, LLP

(57) ABSTRACT

The integrated circuit device disclosed herein includes a substrate, an interlevel dielectric layer disposed over the substrate, an intermetal dielectric layer disposed over the interlevel dielectric layer, an interconnect structure extending through the intermetal dielectric layer, and a through via (TV) extending through the intermetal dielectric layer and at least a portion of the substrate, the through via having a top surface co-planar with a top surface of the interconnect structure. In some embodiments, the through via is formed before the interconnect structure. In other embodiments, the interconnect structure is formed before the through via. In an embodiment, a fin field effect transistor (FinFET) is formed over the substrate.

20 Claims, 20 Drawing Sheets

(52) U.S. Cl.
CPC .. *H01L 23/53238* (2013.01); *H01L 23/53266* (2013.01); *H01L 2924/00* (2013.01); *H01L 2924/0002* (2013.01)

(58) Field of Classification Search
CPC ........... H01L 23/53266; H01L 2924/00; H01L 2924/0002; H01L 21/76832
USPC ........................................................ 438/624
See application file for complete search history.

(56) References Cited

U.S. PATENT DOCUMENTS

| | | | | |
|---|---|---|---|---|
| 2009/0072401 | A1* | 3/2009 | Arnold | H01L 21/76808 257/751 |
| 2009/0278327 | A1* | 11/2009 | Chan | B62K 3/002 280/87.05 |
| 2011/0073997 | A1* | 3/2011 | Leuschner | H01L 21/7681 257/621 |
| 2011/0318923 | A1* | 12/2011 | Park | H01L 21/76801 438/675 |
| 2013/0093098 | A1* | 4/2013 | Yang | H01L 21/76898 257/774 |
| 2013/0113068 | A1* | 5/2013 | Ramachandran | H01L 21/76898 257/506 |
| 2014/0138848 | A1* | 5/2014 | Matsuura | H01L 23/481 257/774 |
| 2014/0217486 | A1* | 8/2014 | Akiyama | H01L 27/14632 257/294 |

* cited by examiner

THROUGH VIA STRUCTURE EXTENDING TO METALLIZATION LAYER

CROSS REFERENCE TO RELATED APPLICATIONS

This application claims the benefit of U.S. Provisional Application No. 61/940,203, filed on Feb. 14, 2014, entitled "TV Structure with 3D Device," which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits, and the like are fabricated on different semiconductor wafers. Two or more semiconductor wafers may be installed on top of one another to further reduce the form factor of the semiconductor device.

In order to electrically connect the active circuits of different wafers, interconnect structures know as through vias (TVs) may be used. However, it may be difficult or impractical to form through via (TV) interconnect structures in 3DIC devices because of tight design specifications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
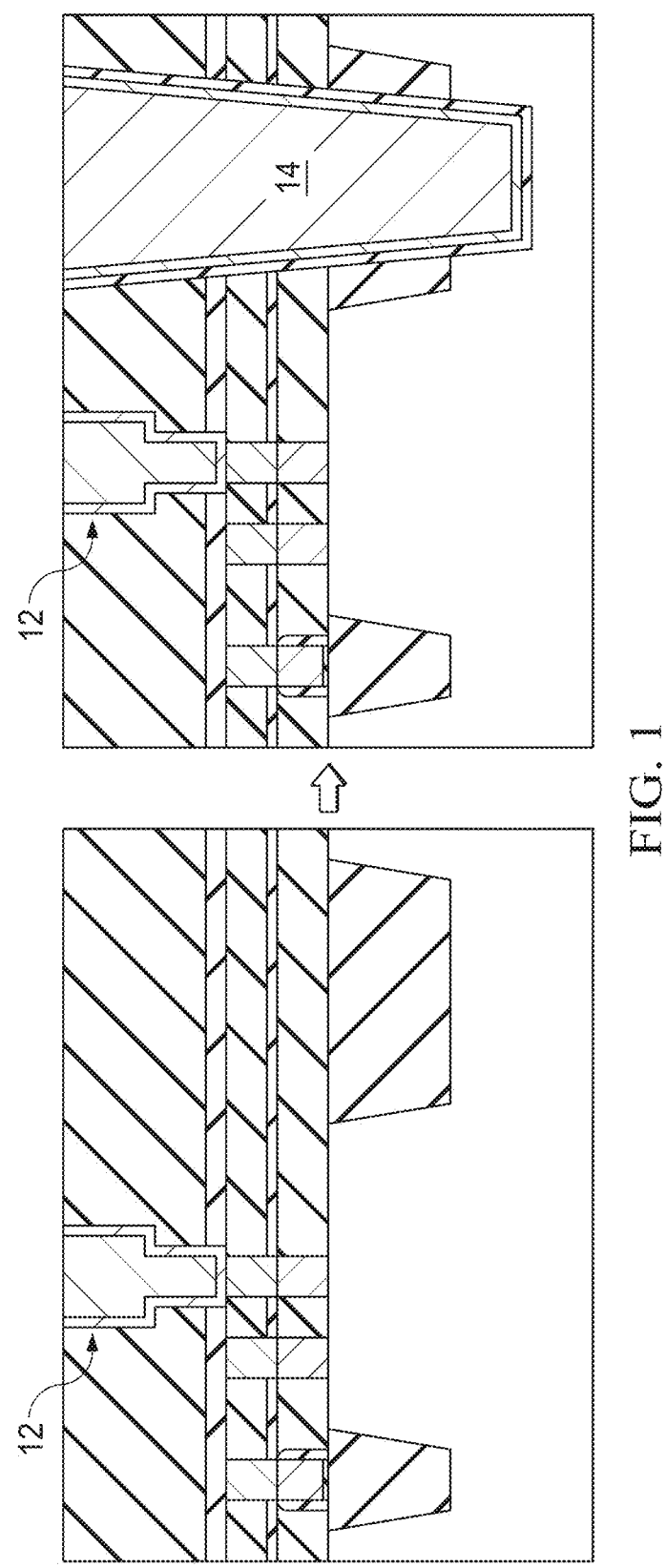
FIG. 1 illustrates various intermediate states of fabricating an integrated circuit using a metal one (M1) formation first process in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In smaller technology nodes, an interlevel dielectric (ILD) layer (or layers) disposed over a substrate within a 3DIC has (or collectively have) a very limited thickness. In other words, the ILD layer can be quite thin. Because of this, the ILD layer may be unintentionally damaged during subsequent processing steps.

For example, during the formation of a through via, a trench is formed through the ILD layer and a portion of the substrate. Thereafter, a conductive material is deposited within the trench and over the ILD layer. In order to remove excess conductive material disposed outside the trench, a planarization process is performed. However, unless the planarization process is precisely controlled, the underlying ILD layer may be damaged.

As will be more fully explained below, embodiments described herein extend a through via to a metallization layer (e.g., M1, M2, etc.). As a result, the ILD layer is no longer subject to potential damage from the planarization process. Indeed, the planarization process used to remove excess conductive material and shape the through via is not performed until the ILD layer is protected by the overlying IMD layer. In other words, if the through via described herein continues up to the level of one of the metal layers, the planarization process used to formulate the through via will be performed down to the intermetal dielectric (IMD) layer instead of down to the extremely thin ILD layer. As such, the ILD layer is no longer subject to damage from planarization.

Figure 2:
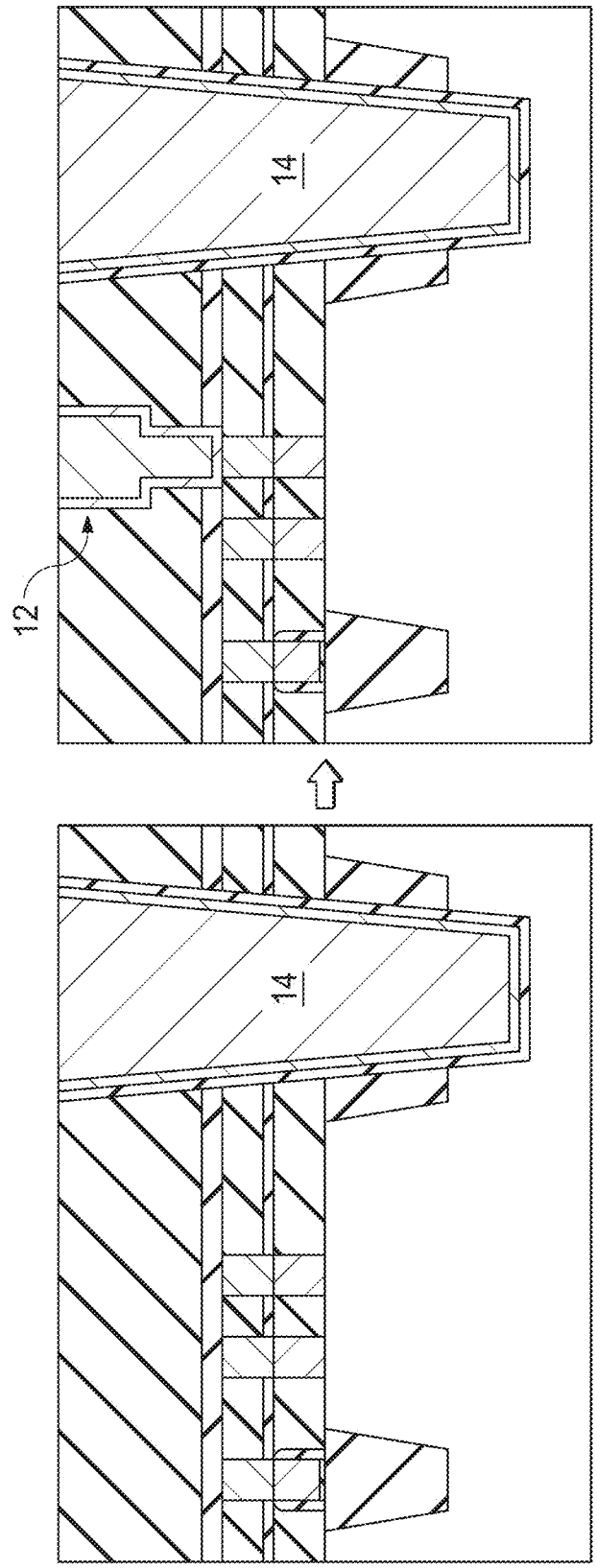
FIG. 2 illustrates various intermediate states of fabricating an integrated circuit using a through via (TV) formation first process in accordance with some embodiments.

FIGS. 1-2 are cross-sectional views illustrating in general terms two different approaches to forming a suitable through via (TV) 14 for a 3DIC or other type of integrated circuit device in accordance with various embodiments. Generally, FIG. 1 illustrates a metallization interconnect first process in which a metallization interconnect, such as an interconnect structure 12, is formed in a first metallization layer (M1) prior to formation of a through via 14. FIG. 2 illustrates a through via first process in which the through via 14 is formed through the metallization layer prior to forming the corresponding interconnect structure 12. The M1 layer is illustrated herein for illustrative purposes, and other embodiments may utilize one or more other metallization layers, such as metallization layers second metallization layer (M2) to an upper most metallization layer (Mn). The metallization interconnect first process of FIG. 1 is discussed in greater detail below with reference to FIGS. 3A-3G, and the through via first process of FIG. 2 is discussed in greater detail below with reference to FIGS. 4A-4G.

By extending the through via 14 through one or more of the metallization layers, to level with a top surface of the interconnect structure 12 as shown in FIGS. 1-2, the through via 14 may be suitably formed even when a thickness of the interlevel dielectric layer (or layers) is extremely limited, such as in N16 structures or applications.

Figure 3A:
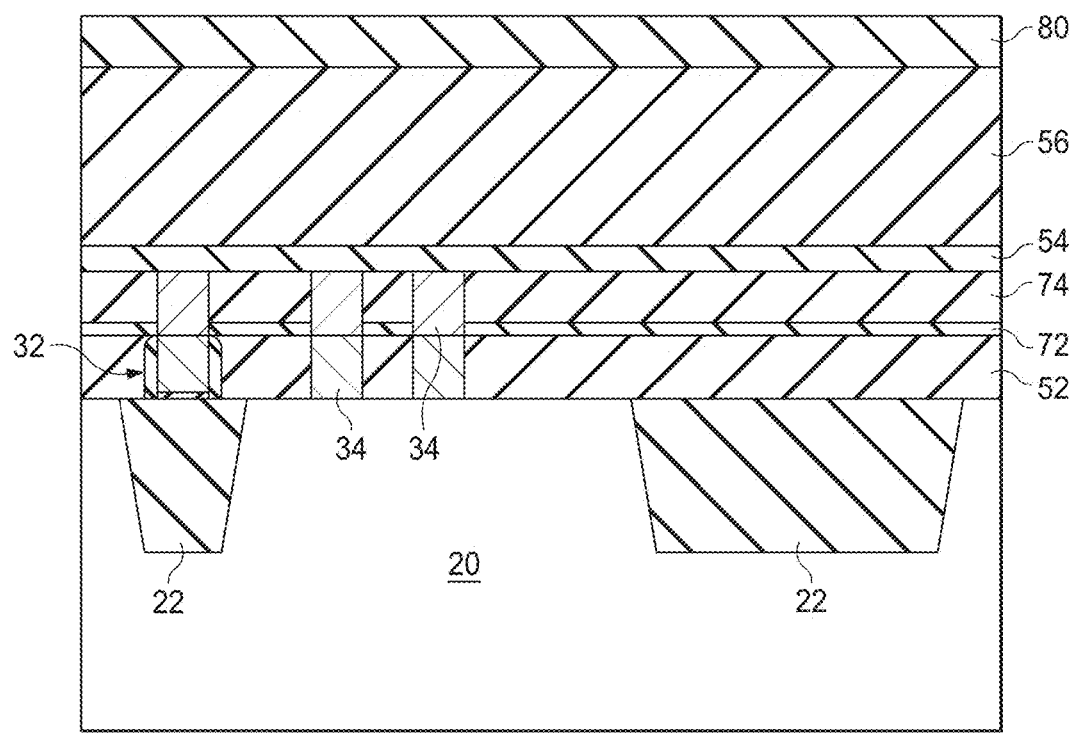
FIGS. 3A-3G collectively illustrate the M1 formation first process in greater detail in accordance with some embodiments.

Referring now to FIGS. 3A-3G, the M1 formation first process is depicted in greater detail in accordance with some embodiments. Referring first to FIG. 3A, a substrate 20 having isolation regions 22 is provided. The substrate 20 may be made of a semiconductor material such as silicon, bulk silicon (doped or undoped), germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 20 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. Other substrates that may be used include multi-layered substrates, gradient substrates, or hybrid orientation substrates.

One or more isolation regions 22 may be formed in the substrate 20. In some embodiments, the isolation regions 22 are shallow trench isolation (STI) regions. The isolation regions 22 function to isolate, for example, devices or electrical components from one another. The isolation regions 22 may also define an active area of an integrated circuit. As shown in FIG. 3A, the isolation regions 22 extend from the top surface of the substrate 20 to an intermediate level of the substrate 20.

Still referring to FIG. 3A, a first interlevel dielectric (ILD) layer 52 is formed over the substrate 20. The interlevel dielectric layer ILD may be formed of low-k dielectric materials, for example, with k values less than about 3.0, or even less than about 2.5. In an embodiment, the interlevel dielectric layer 52 may be formed from phosphosilicate glass (PSG), borophosphosilicate glass (BPSG), fluorosilicate glass (FSG), $SiO_xC_y$, Tetraethyl Orthosilicate (TEOS) oxide, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD).

One or more devices, collectively represented in FIGS. 3A-3G by a fin field effect transistor (FinFET) 32, may be formed on the substrate 20. As shown, the first interlevel dielectric layer 52 is then formed over the fin field effect transistor 32 or other transistor. For ease of illustration, the fin field effect transistor 32 in FIG. 3A has been simplified and represented in general terms. Even so, a more detailed description of the structure of the fin field effect transistor 32 is provided below in connection with FIG. 7.

As shown, one or more contacts 34 extend through the first interlevel dielectric layer 52. In an embodiment, the contacts 34 are formed from tungsten (W) or another suitable contact material. Although not illustrated in FIG. 3A, the contacts 34 may be electrically coupled to a transistor or another electrical component.

An etch stop layer 72 and a second interlevel dielectric layer 74 are disposed over the first interlevel dielectric layer 52. In an embodiment, the etch stop layer 72 is formed from a dielectric material such as oxide, nitride, carbide, or the like. The etch stop layer 72 may also have a multi-layer structure having more than one layer. The second interlevel dielectric layer 74 may be formed in the manner and from the materials noted above with regard to first interlevel dielectric layer 52. In an embodiment, interlevel dielectric material 74 and first interlevel dielectric layer 52 are formed from the same material. In an embodiment, interlevel dielectric material 74 and first interlevel dielectric layer 52 are formed from different materials.

In an embodiment, one or more of the contacts 34 extend through the second interlevel dielectric layer 74. The contacts 34 in the interlevel dielectric layer 74 are electrically coupled to the contacts 34 in the first interlevel dielectric layer 52 or the fin field effect transistor 32 (or other transistor) as shown in FIG. 3A. Contacts 34 in the first interlevel dielectric layer 52 and contacts 34 in the second interlevel dielectric layer 74 are collectively referred to as contacts 34.

Another etch stop layer 54 may be formed over the second interlevel dielectric layer 74 to aid in subsequent etching processes as described below. The etch stop layer 54 is formed from a dielectric material such as oxide, nitride, carbide, or the like. The etch stop layer 54 may also have a multi-layer structure having more than one layer.

An intermetal dielectric (IMD) layer 56 is formed over the etch stop layer 54. In an embodiment, the first intermetal dielectric layer 56 is formed from an extremely low-k (ELK) dielectric. In an embodiment, the first intermetal dielectric layer 56 may be formed in the manner and from the materials noted above with regard to first interlevel dielectric layer 52.

As shown in FIG. 3A, a cap layer 80 is formed over the first intermetal dielectric layer 56. In an embodiment, the cap layer 80 protects the underlying first intermetal dielectric layer 56 during further processing (e.g., chemical mechanical planarization (CMP)). In an embodiment, the cap layer 80 is a layer of silicon oxide, silicon nitride, or silicon oxynitride formed by a plasma enhanced chemical vapor deposition process.

It should be recognized that the above-noted structures in FIG. 3A have been provided for illustrative purposes and other and/or different structures may be present in other embodiments. For example, the structure shown in FIG. 3A may also include source/drain regions, stress layers, spacers, a gate or gate stack, a gate oxide, and so on.

Figure 3B:
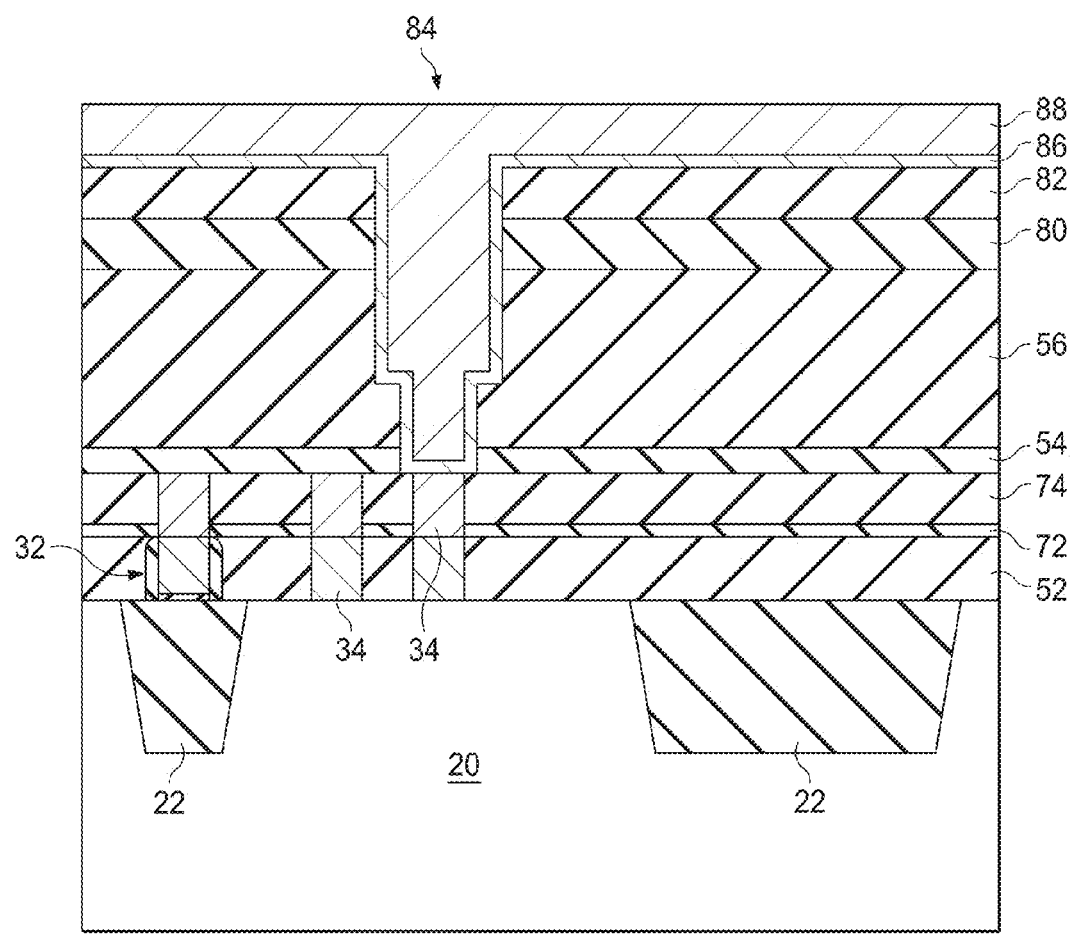

As shown in FIG. 3B, the process of forming the interconnect structure 12 (FIGS. 1-2) is illustrated in an intermediate stage. The interconnect structure 12 may be formed using a variety of different methods or techniques such as a damascene process or a dual-damascene process. In some embodiments, formation of the interconnect structure 12 involves forming a hard mask, a photolithography process, and so on.

In some embodiments, a hard mask layer 82 is formed over the cap layer 80. The hard mask layer 82 may be formed of any suitable material that provides sufficient etch rate selectivities with the underlying materials. In accordance with some embodiments, the hard mask layer 82 may be formed from titanium nitride (TiN). Once the hard mask layer 82 has been formed, a patterning process is performed. As part of the patterning process, first the hard mask layer 82 is etched and then the underlying materials (e.g., the cap layer 80 and the first intermetal dielectric layer 56) are etched to generate a trench 84 that extends into the first intermetal dielectric layer 56.

In an embodiment, the hard mask layer 82 is patterned using photolithography. Photolithography (e.g., optical lithography, UV lithography) uses light to transfer a geometric pattern from a photomask to a light-sensitive chemical photoresist on the substrate. Thereafter, a series of chemical treatments then either engraves the exposure pattern into the material under the photo resist or enables deposition of a new material in the desired pattern upon the material underneath the photo resist.

In some embodiments, a barrier layer 86 is formed over the hard mask layer 82 and the exposed surfaces of the trench 84. In an embodiment, the barrier layer 86 is formed from materials including Ta, W, Mo, Ti, TiW, TiN, TaN, WN, TiSiN, or TaSiN, which can be deposited by physical vapor deposition (PVD) or chemical vapor deposition (CVD). Next, the trench 84 is filled with a suitable conductive material 88 such as copper, a copper-alloy, aluminum, tungsten, and so on. In an embodiment, a seed layer is formed and an electro-copper plating process is performed to fill the trench 84 with copper or a copper alloy.

Figure 3C:
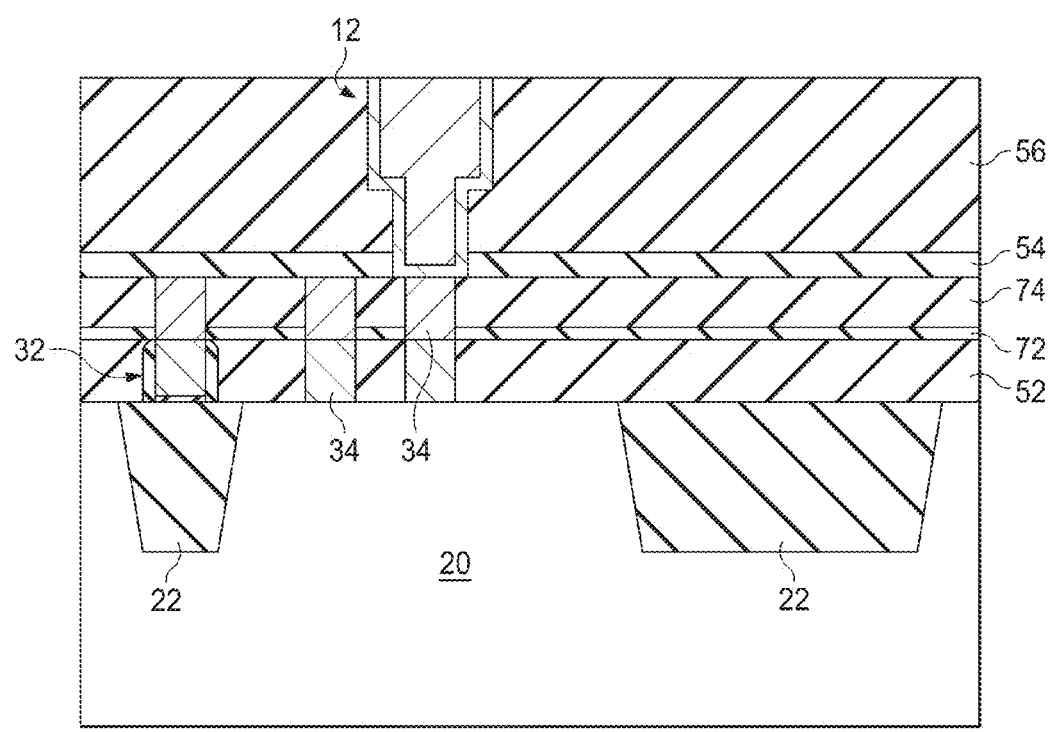

As shown in FIG. 3C, a chemical mechanical planarization process is performed to remove excess conductive material 88, the cap layer 80, the hard mask 82, and the barrier layer 86 from an upper surface of the intermetal dielectric 56 outside the trench 84 and to produce the interconnect structure 12. As noted above, the cap layer 80 protects the underlying first intermetal dielectric layer 56 during the chemical mechanical planarization process.

Figure 3D:
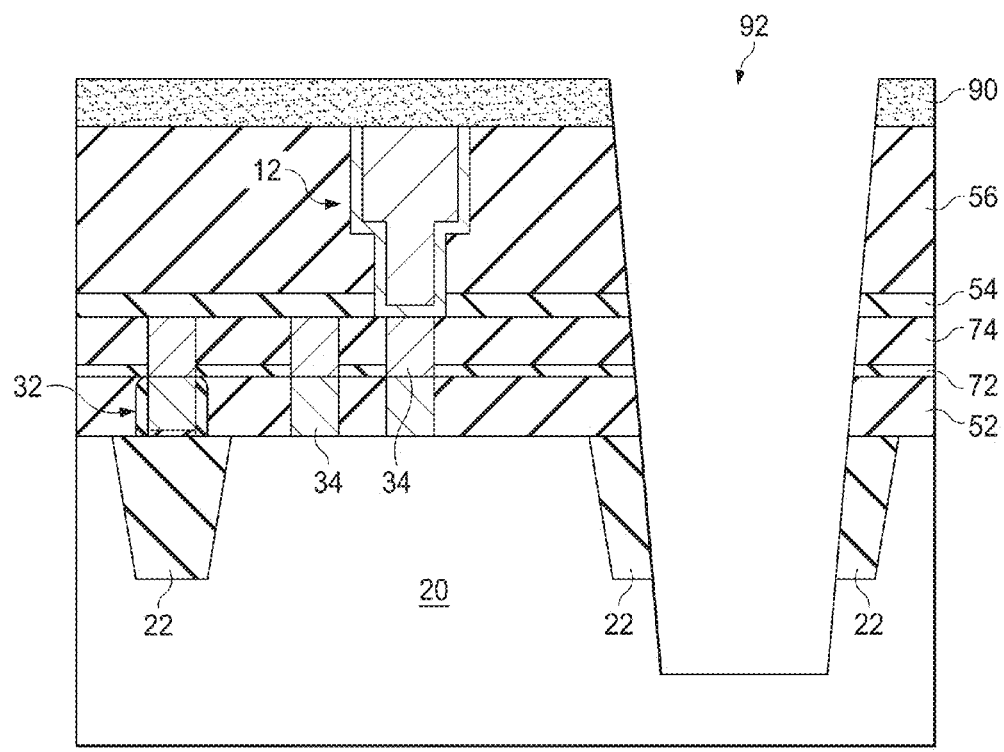

Referring now to FIG. 3D, once the interconnect structure 12 has been formed, a stop layer 90 is formed over the intermetal dielectric layer 56 and the interconnect structure 12. In an embodiment, the stop layer 90 is an anti-reflective layer capable of protecting the underlying first intermetal dielectric layer 56 during further processing (e.g., a later CMP process). Thereafter, a subsequent patterning process is performed to generate another trench 92. As shown, the trench 92 extends from the stop layer 90 into the underlying substrate 20.

Figure 3E:
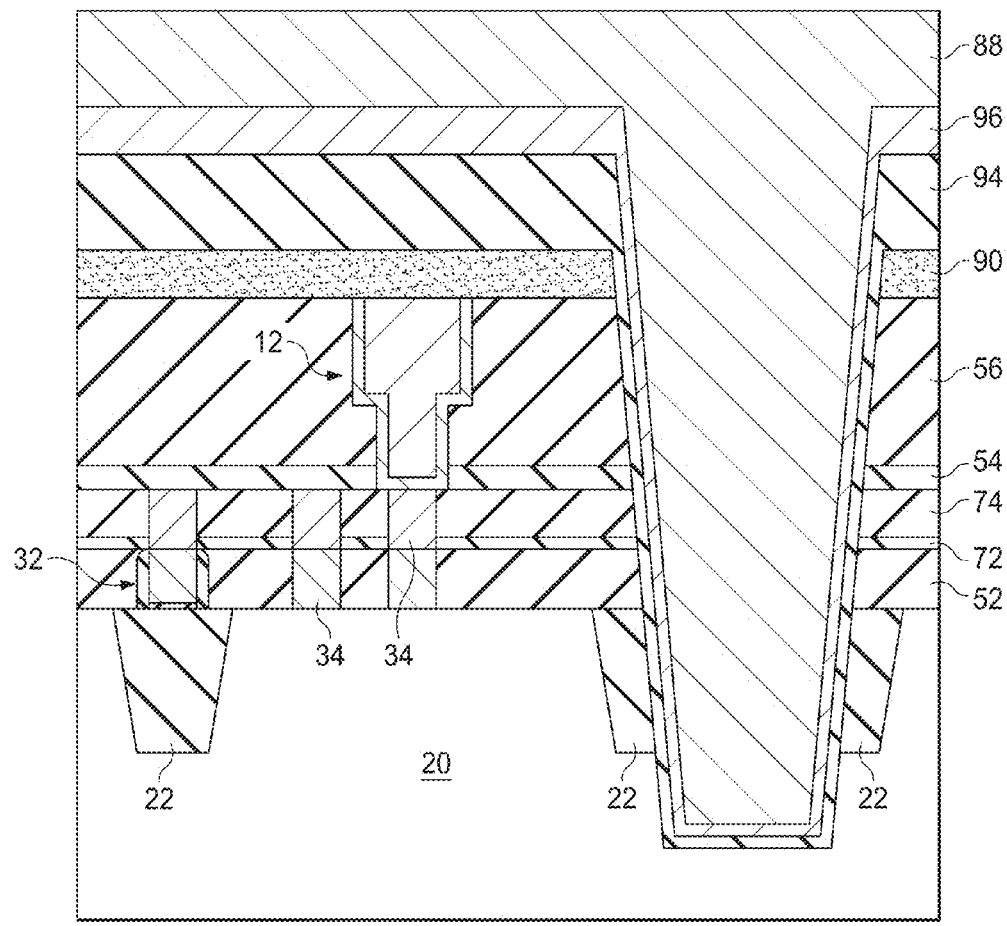

As shown in FIG. 3E, the trench 92 may be filled with a suitable conductive material 88 such as copper, a copper-alloy, aluminum, tungsten, and the like. In an embodiment, a seed layer is formed and an electro-copper plating process is performed to fill the trench 92 with copper or a copper alloy.

In some embodiments, a liner 94 is formed over the stop layer 90 and the exposed surfaces of the trench 92. In an embodiment, the liner 94 is formed from silicon dioxide or another suitable liner material. Thereafter, a barrier layer 96 may be formed over the liner 94. In an embodiment, the barrier layer 96 is formed from materials including Ta, W, Mo, Ti, TiW, TiN, TaN, WN, TiSiN, or TaSiN, which can be deposited by physical vapor deposition (PVD) or chemical vapor deposition (CVD).

Figure 3F:
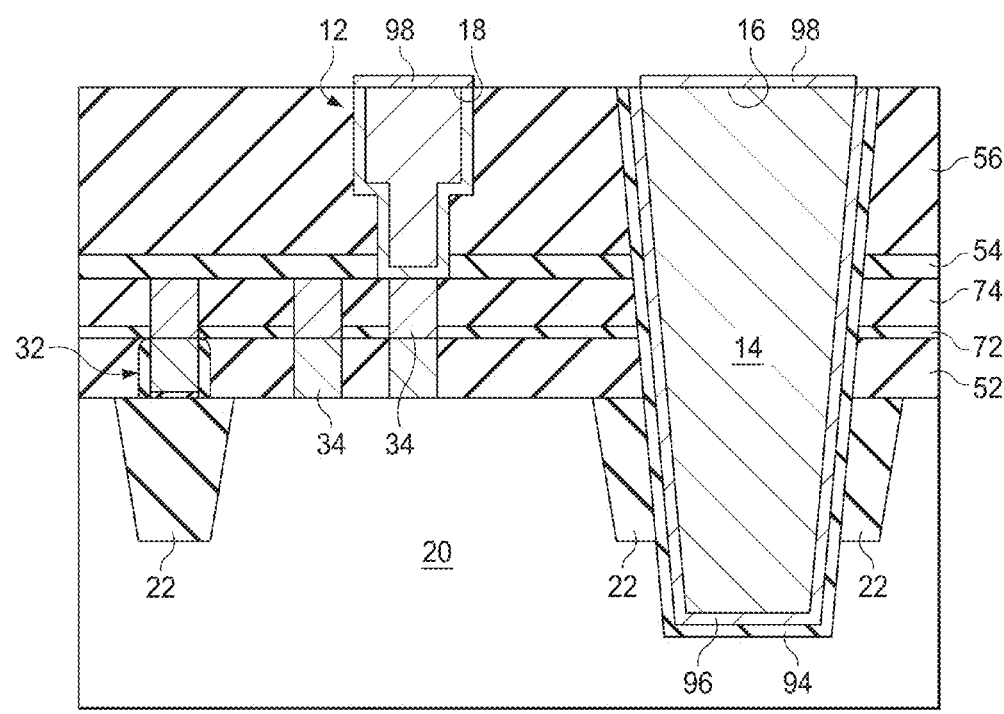

As shown in FIG. 3F, a chemical mechanical planarization process is performed to remove excess conductive material 88, the stop layer 90, the liner 94, and the barrier layer 96 from an upper surface of the first intermetal dielectric layer 56 and to produce the through via 14. The through via 14 may be formed using a variety of different methods or techniques. For example, the through via 14 may be formed using different metals, with protective or insulating layers, and/or using different formation processes.

By forming the through via 14 such that a top surface 16 is co-planar with a top surface 18 of the interconnect structure 12, the through via 14 may be suitably formed even when the interlevel dielectric layers 52, 74 are extremely thin. In other words, by bringing the through via 14 up to the level of the top of the interconnect structure 12, the through via 14 may be used within a 3DIC structure offering only a thin interlevel dielectric.

After the through via 14 is formed, a cap layer 98 may be selectively formed over the interconnect structure 12 and the through via 14. In an embodiment, the cap layer 98 inhibits or prevents copper diffusion and may be formed from, for example, cobalt (Co) or the like. In an embodiment, the cap layer 98 is formed through a selective chemical vapor deposition (CVD) process.

Figure 3G:
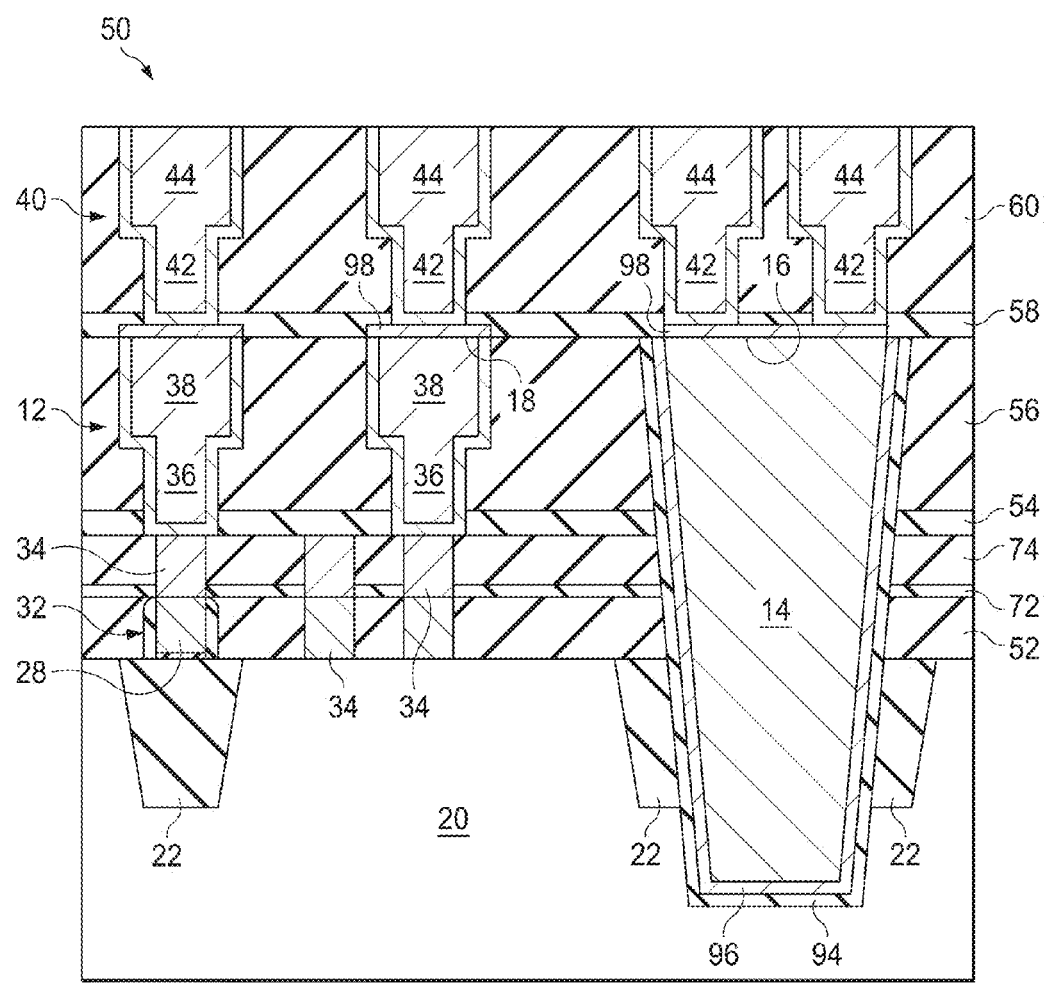

Referring now to FIG. 3G, an integrated circuit 50 in accordance with some embodiments is illustrated. As shown, the interconnect structure 12 includes a metal via 36 underlying a metal layer 38. In an embodiment, the metal layer 38 is closer to the substrate 20 than other metal layers in the integrated circuit 10 (e.g., the metal layer 38 may be metal one (M1)). In addition, the metal via 36 closest to the substrate 20 may be referred to as via zero (V0). As the metallization layers proceed further away from the substrate, the numbers of the metallization layers increment (e.g., M2, M3, etc., and V1, V2, etc.). In an embodiment, both the metal layer 38 and the metal via 36 are formed from the same material such as, for example, copper (Cu) or a copper alloy.

An etch stop layer 58 and a second intermetal dielectric layer 60 are disposed over the first intermetal dielectric layer 56. In an embodiment, the etch stop layer 58 is disposed over the top surface 18 of the interconnect structure 12 (i.e., over a top surface of metal layer 38) and a portion of the top surface 16 of the through via 14. The etch stop layer 58 and the first intermetal dielectric layer 56 may be formed in the manner and from the materials noted above for the intermetal dielectric layer 52 and the etch stop layer 72, respectively.

As shown, additional interconnect structures 40 (e.g., damascene or dual-damascene structures) are formed in the second intermetal dielectric layer 56. In an embodiment, the additional interconnect structures 40 include a metal via 42 and a metal layer 44. The metal via 42 may be referred to as via one (V1) and the metal layer 44 may be referred to as metal two (M2). In an embodiment, the through via 14 may extend up to, and be parallel with, a top surface of the additional interconnect structures 40. In other words, the through via 14 may be co-planar with the top surface of the metal layer 44 (e.g., M2).

In practical applications, further interconnect structures may be formed over and electrically coupled to the additional interconnect structures 40. For example, the integrated circuit device 50 may include further dual-damascene structures including metal vias (e.g., V2, V3, etc.) and metal layers (e.g., M3, M4, etc.). In an embodiment, the through via 14 may extend up to, and be parallel with, a top surface of one of the further interconnect structures. In other words, the through via 14 may be co-planar with the top surface of one of the upper metal layers (e.g., M3, M4, etc.).

The interconnect structures 40 are electrically coupled to the underlying interconnect structures 12 or the through via 14. As shown in FIG. 3G, the through via 14 extends through a portion of the substrate 20, the insulation region 22, the interlevel dielectric layers 52, 74, the etch stop layers 72, 54, and the first intermetal dielectric layer 56.

Figure 4A:
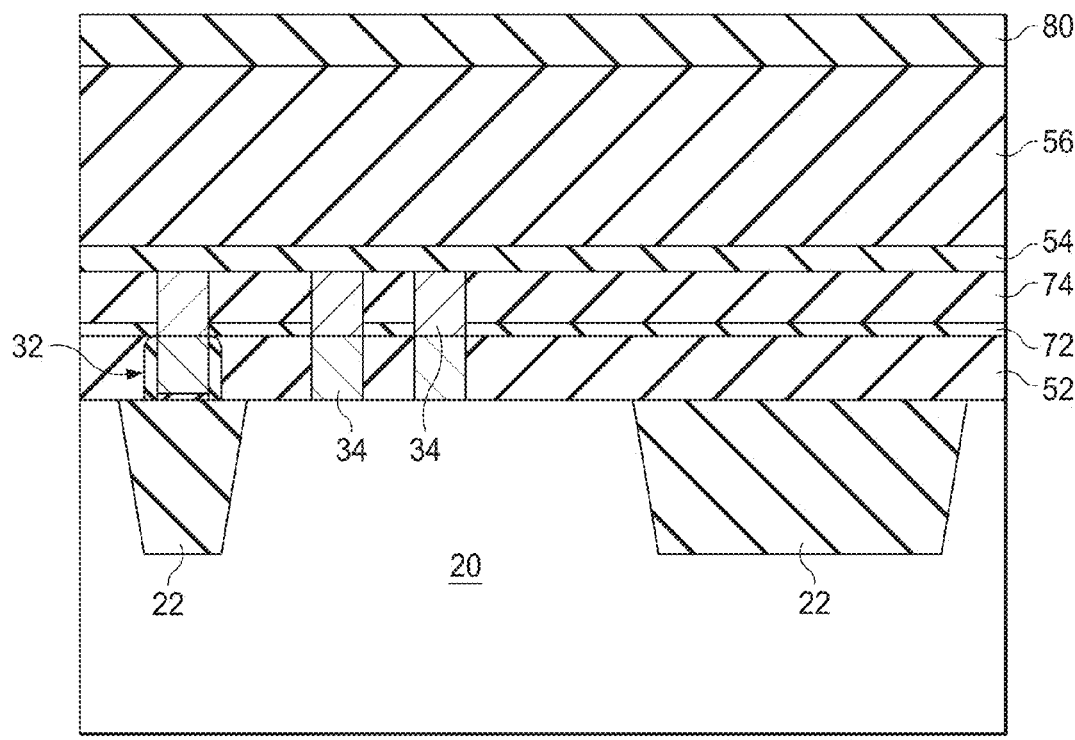
FIGS. 4A-4F collectively illustrate the TV formation first process in greater detail in accordance with some embodiments.

Referring now to FIGS. 4A-4F, the through via formation first process is depicted in greater detail. After the metal contacts 34 and the fin field effect transistor 32 (or other transistors) have been formed as discussed above, the intermetal dielectric (IMD) layer 56 is formed over the upper etch stop layer 54 as shown in FIG. 4A. Thereafter, the cap layer 80 is formed over the first intermetal dielectric layer 56. In an embodiment, the cap layer 80 protects the underlying first intermetal dielectric layer 56 during further processing (e.g., a CMP process).

Figure 4B:
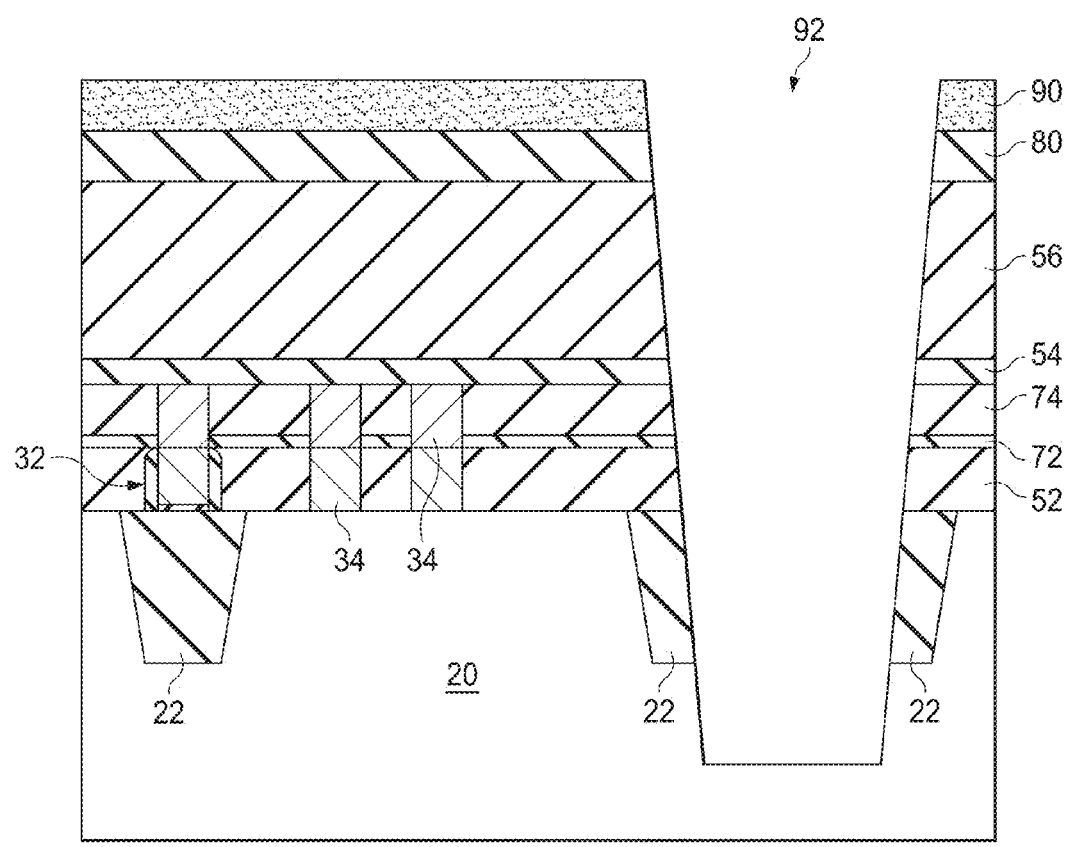

Referring now to FIG. 4B, the stop layer 90 is formed over the cap layer 80. In an embodiment, the stop layer 90 is an anti-reflective layer capable of protecting the underlying first intermetal dielectric layer 56 during further processing (e.g., a later CMP process). Thereafter, a patterning process is performed to generate the trench 92. As shown, the trench 92 extends from the stop layer 90 down into the underlying substrate 20.

Figure 4C:
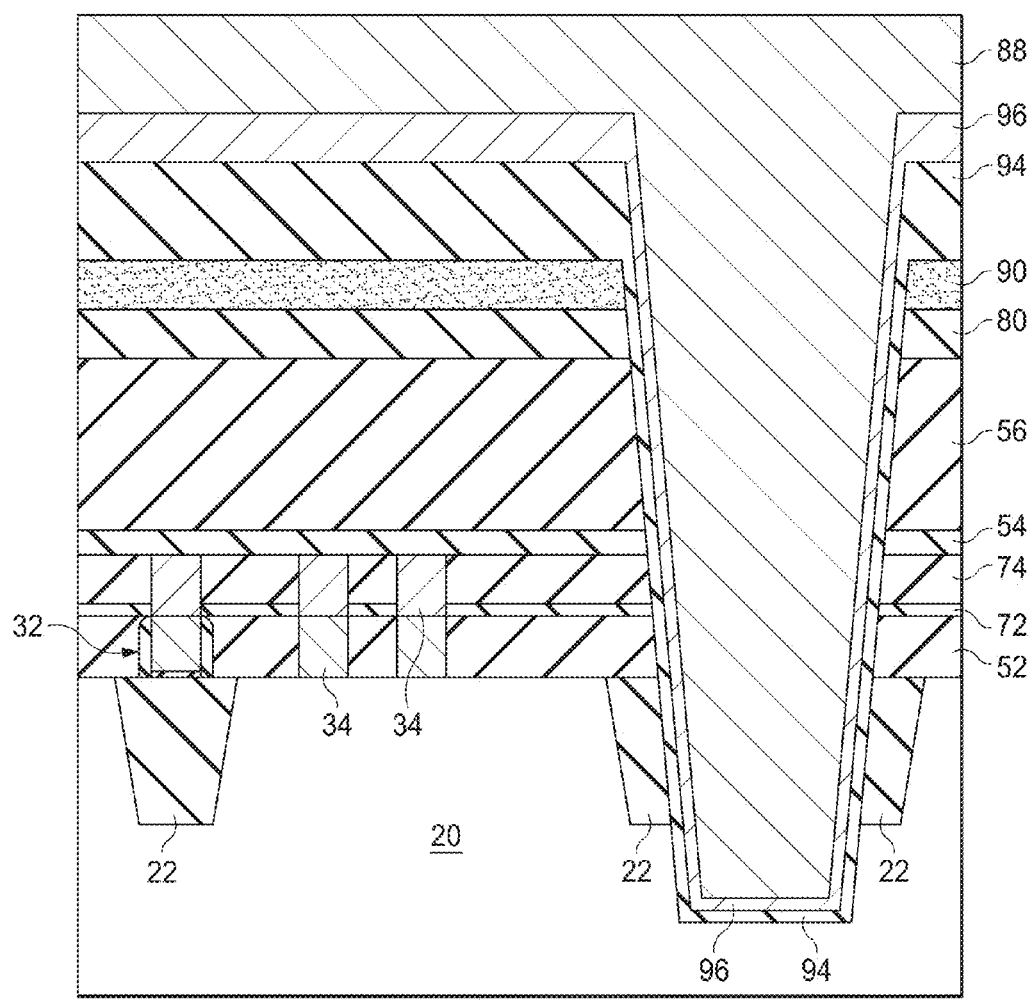

As shown in FIG. 4C, the liner 94 is formed over the stop layer 90 and the exposed surfaces of the trench 92. In an embodiment, the liner 94 is formed from silicon dioxide or another suitable liner material. Thereafter, the barrier layer 96 is formed over the stop layer 90. In an embodiment, the barrier layer 96 is formed from materials including Ta, W, Mo, Ti, TiW, TiN, TaN, WN, TiSiN, or TaSiN, which can be deposited by physical vapor deposition (PVD) or chemical vapor deposition (CVD). Next, the trench 92 is filled with a suitable conductive material 88 such as copper, a copper-alloy, aluminum, tungsten, and the like. In an embodiment, a seed layer is formed and an electro-copper plating process is performed to fill the trench 92 with copper or a copper alloy.

Figure 4D:
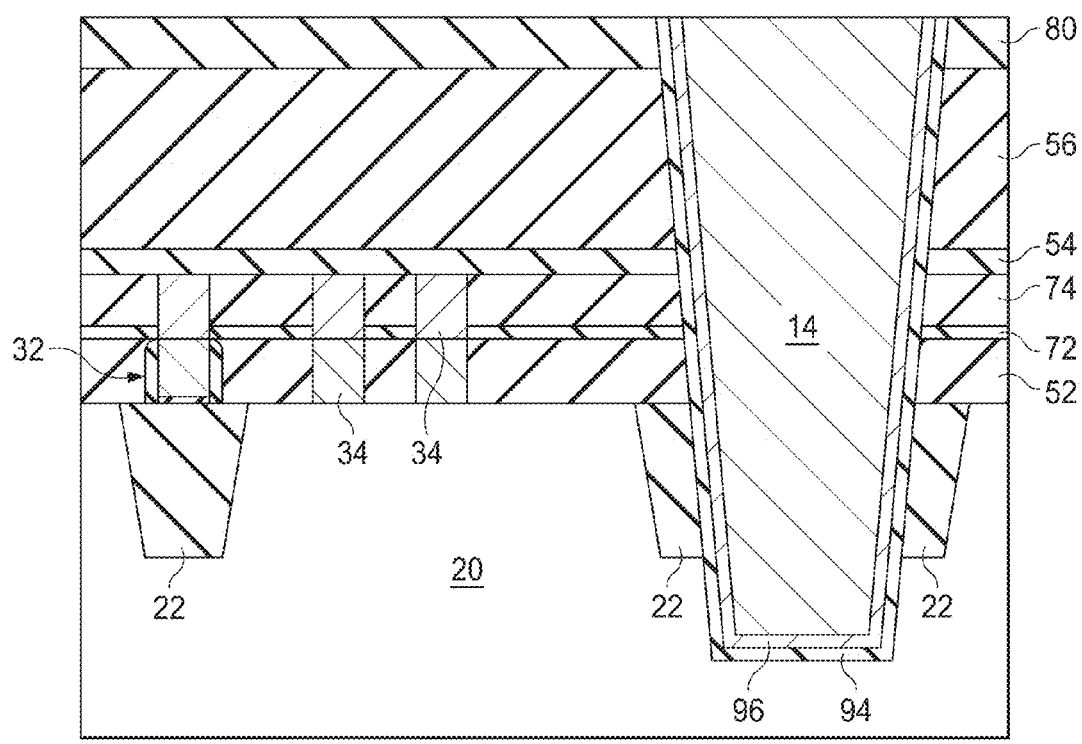

As shown in FIG. 4D, a chemical mechanical planarization process is performed to remove excess conductive material 88, the barrier layer 86, the liner 94, and the stop layer 90 outside the trench 92 and to produce the through via 14. In an embodiment, the cap layer 80, or a portion thereof, survives the CMP process as shown in FIG. 4D.

Figure 4E:
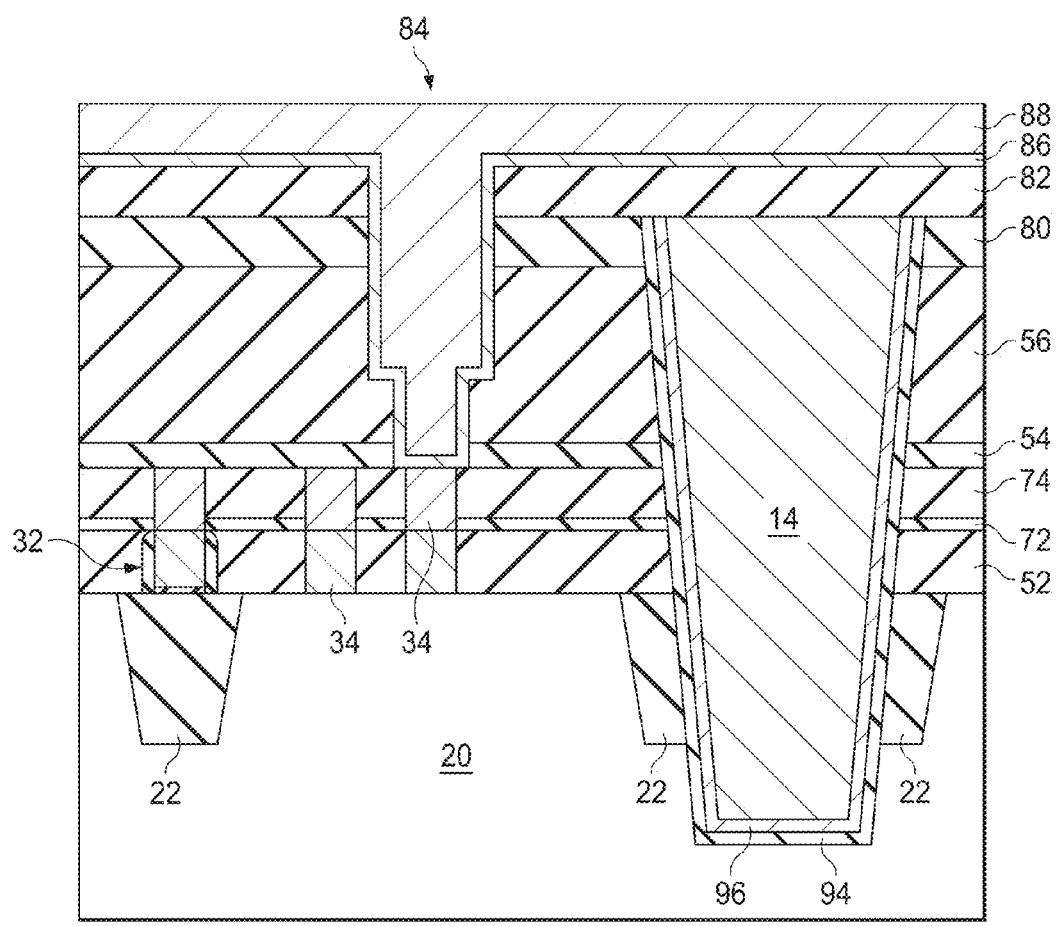

As shown in FIG. 4E, the hard mask layer 82 is formed over the cap layer 80 and the through via 14. In an embodiment, the hard mask layer 82 is formed from titanium nitride (TiN) or another suitable hard mask material. Once the hard mask 82 has been formed, a patterning process is performed to form the trench 84 that extends into the first intermetal dielectric layer 56. Thereafter, the barrier layer 86 is formed over the hard mask layer 82 and the exposed surfaces of the trench 84. Next, the trench 84 is filled with a suitable conductive material 88 such as copper, a copper-alloy, aluminum, tungsten, and the like. In an embodiment, a seed layer is formed and an electro-copper plating process is performed to fill the trench 84 with copper or a copper alloy.

Figure 4F:
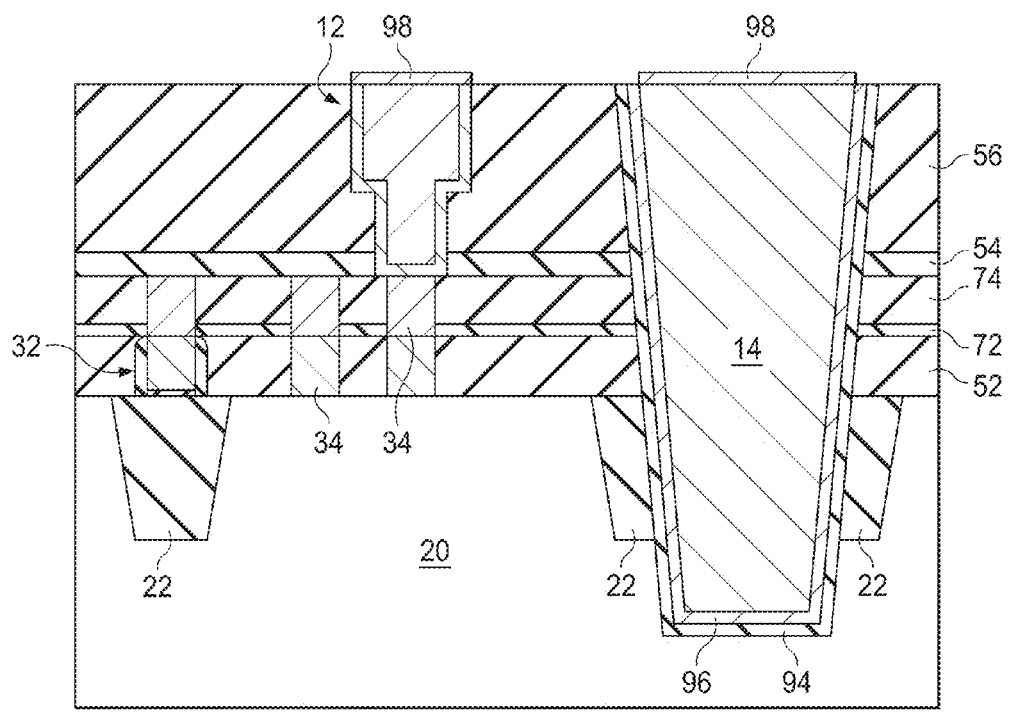

As shown in FIG. 4F, a chemical mechanical planarization process is performed to remove excess conductive material 88, the hard mask 82, and the barrier layer 86 outside the trench 84 and to produce the interconnect structure 12. By forming the through via 14 such that the top surface 16 is co-planar with the top surface 18 of the interconnect structure 12, the through via 14 may be suitably formed even when the interlevel dielectric layers 52, 74 are extremely thin. In other words, by bringing the through via 14 up to the level of the top of the interconnect structure 12, the through via 14 may be used within a 3DIC structure offering only a thin interlevel dielectric.

After the interconnect structure 12 has been formed, the cap layer 98 may be selectively formed over the interconnect structure 12 and the through via 14. In an embodiment, the cap layer 98 is formed through a chemical vapor deposition (CVD) process. As noted above, additional of the interconnect structures 40 may be formed over, and electrically coupled to the interconnect structures 12 or the through via 14 (see FIG. 3G).

Figure 5:
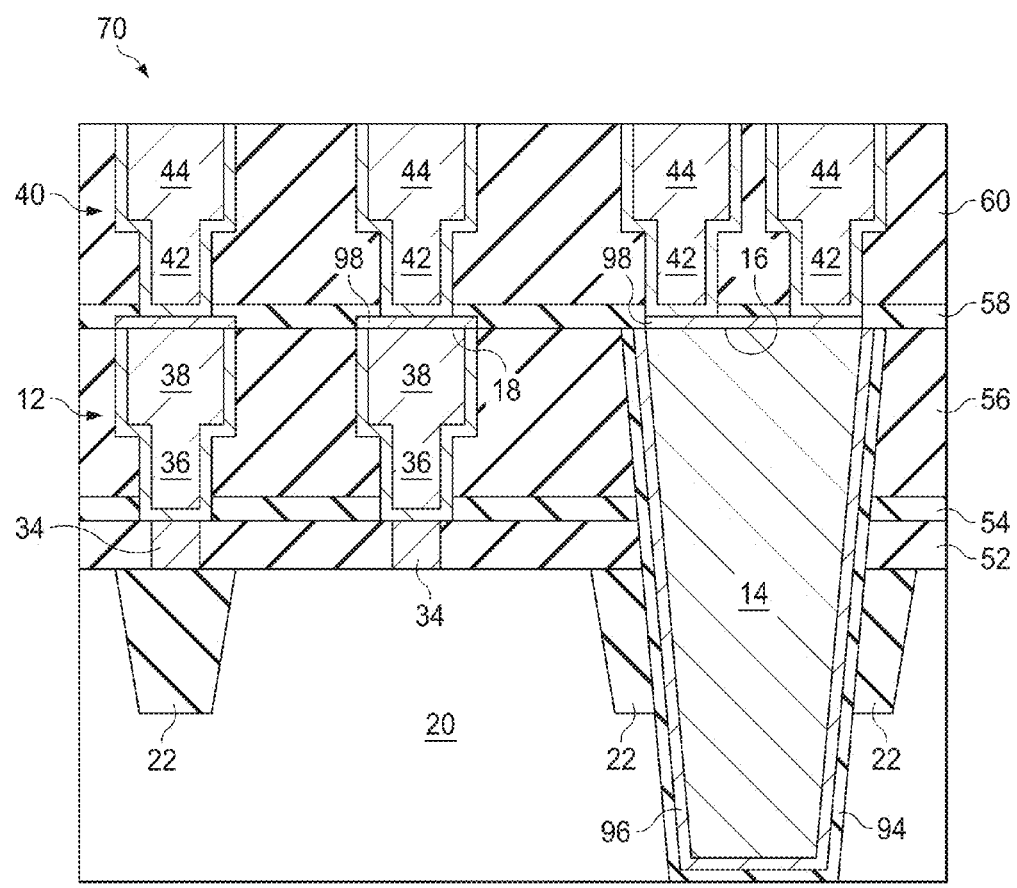
FIG. 5 illustrates a cross section of an integrated circuit having a through via and an interconnect structure with co-planar top surfaces in accordance with some embodiments.

Referring now to FIG. 5, an integrated circuit 70 in accordance with some embodiments is illustrated. The embodiment integrated circuit 70 of FIG. 5 shares numerous features and structures with the integrated circuit 50 of FIG. 3G. Therefore, similar reference numbers will be used to identify like items where practical. Unlike the integrated circuit 50 of FIG. 3G, the integrated circuit 70 incorporates a single first interlevel dielectric layer 52. In other words, the second interlevel dielectric layer 74 found in FIG. 3G is not included in the integrated circuit 70 of FIG. 5.

Figure 6A:
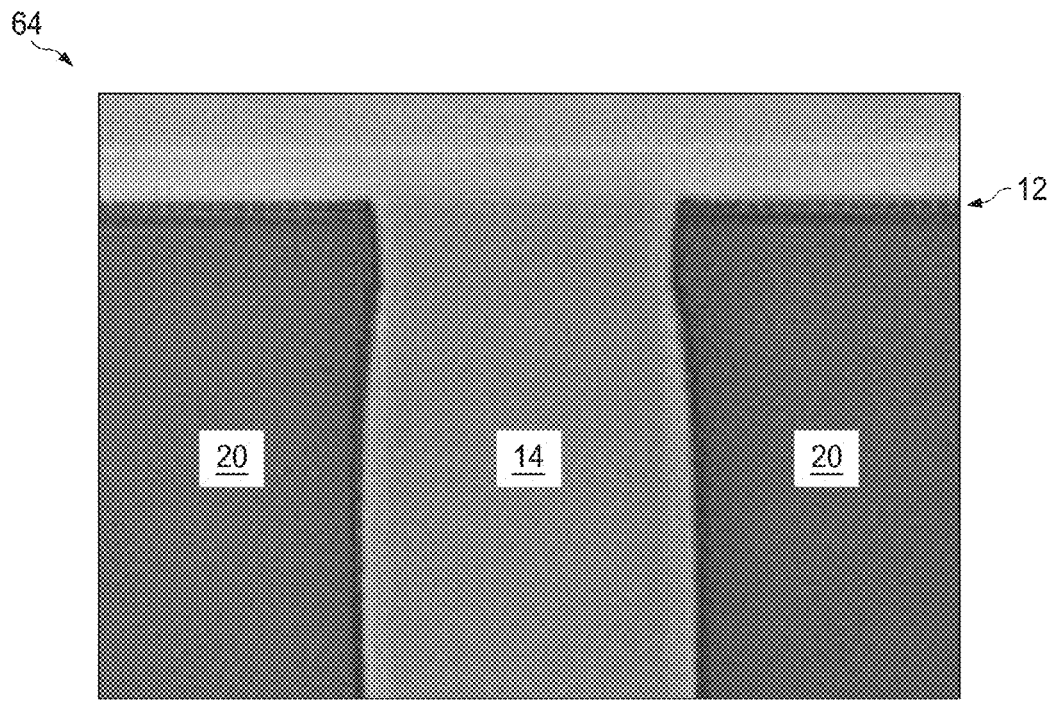
FIGS. 6A-6B illustrate micrograph images depicting the through via and the interconnect structure in varying levels of detail in accordance with some embodiments.
Figure 6B:
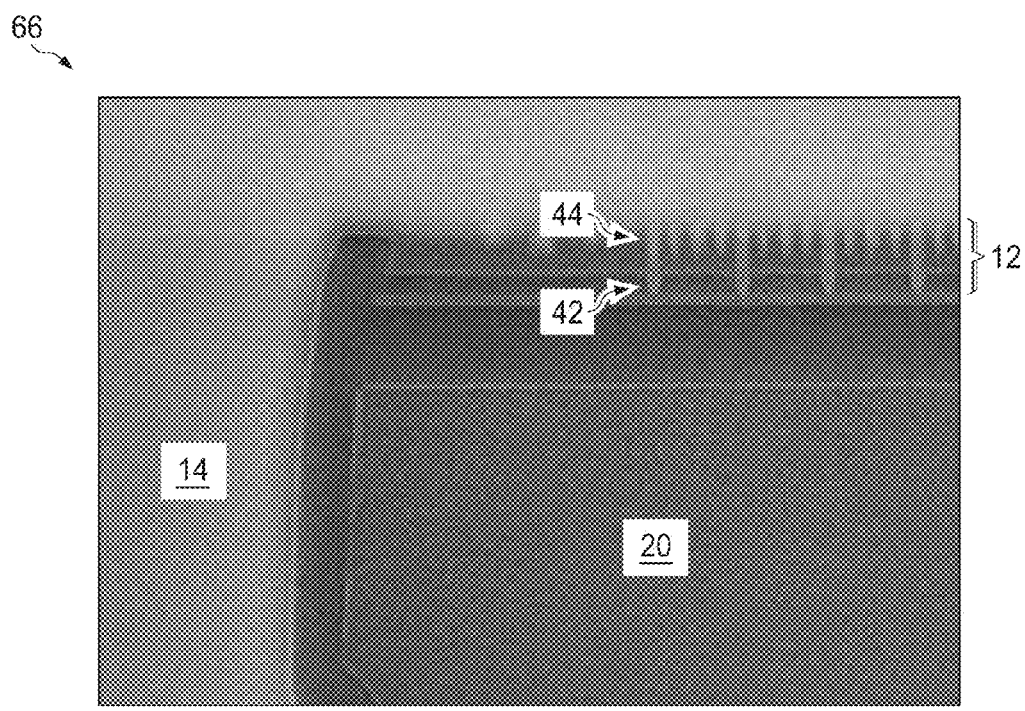

Referring now to FIGS. 6A-6B, micrograph images 64, 66 illustrating the through via 14 relative to the interconnect structure 12 in cross-section are provided. As shown in the images 64, 66, the through via 14 and the interconnect structure 12 are substantially co-planar, as described above.

Figure 7:
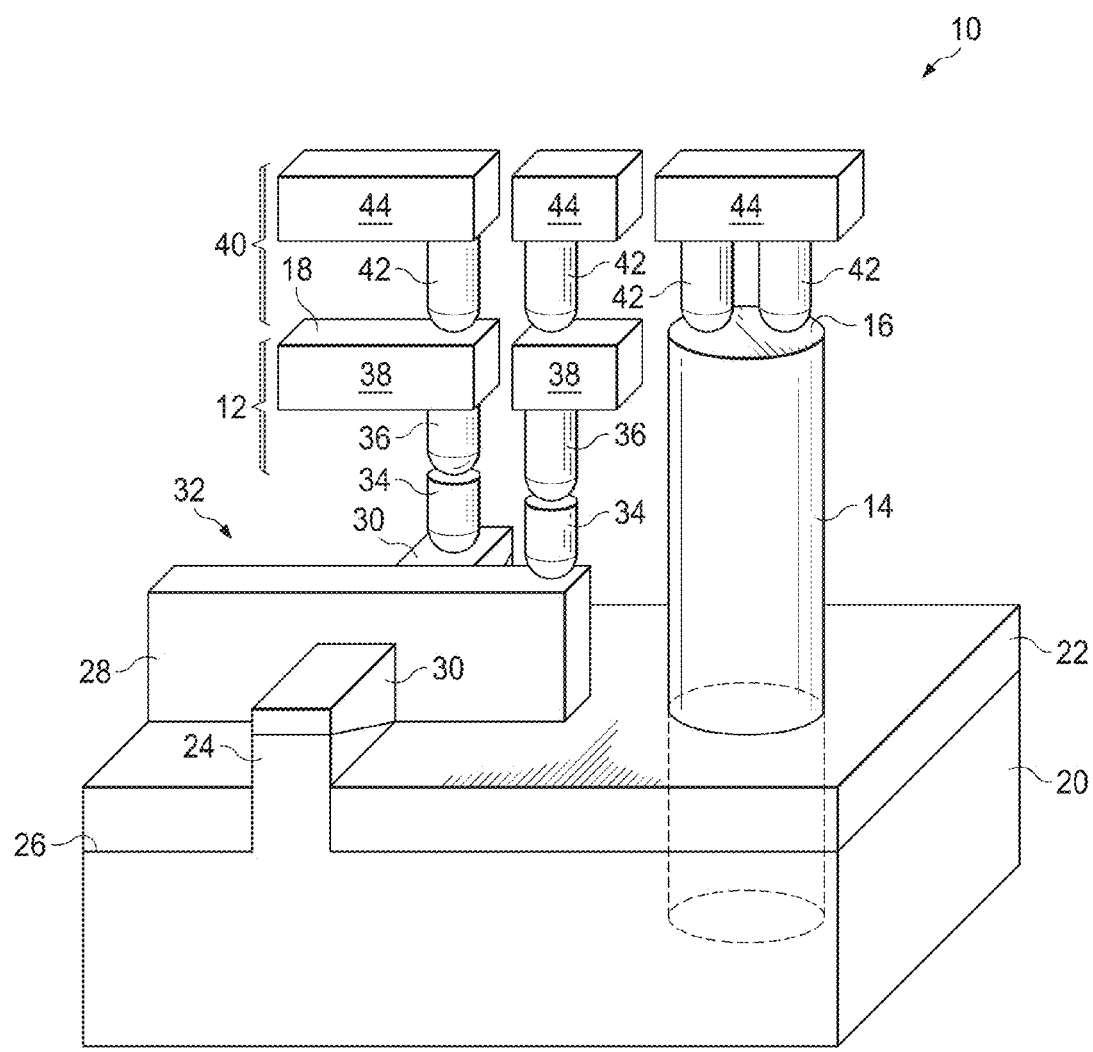
FIG. 7 is a perspective view of an integrated circuit device having a through via and an interconnect structure with co-planar top surfaces in accordance with some embodiments.

Referring now to FIG. 7, an embodiment integrated circuit device 10 is illustrated in general terms. The integrated circuit device 10 includes the interconnect structure 12 and the through via 14. However, for ease of illustration the ILD layers 52, 74 and the IMD layer 56 discussed above have been omitted in FIG. 7.

In an embodiment, the through via 14 is formed such that the top surface 16 of the through via 14 is co-planar with the top surface 18 of the interconnect structure 12. In an embodiment, the integrated circuit 10 of FIG. 7 may employ a single-damascene structure or dual-damascene structure for the interconnect structure 12. In such embodiments, the top surface of the interconnect structure in the integrated circuit 10 and the top surface of the through via 14 should still be co-planar or substantially co-planar.

Still referring to FIG. 7, the integrated circuit device 10 includes the isolation region 22 formed in the semiconductor substrate 20. In an embodiment, the semiconductor substrate 20 is formed from any of the materials noted above. In an embodiment, the isolation region 22 is a shallow trench isolation (STI) region. As shown, a fin 24 extends from a top surface 26 of the substrate 20 and passes through the isolation region 22. While a single fin 24 is depicted in FIG. 7, it should be recognized that numerous fins many be formed in practical applications.

At least one gate structure 28 wraps over the fin 24. Source/drain regions 30 are formed in the fin 24 on opposing sides of the gate structure 28. The fin 24, the gate 28, the source/drain regions 30 and associated structures collectively form the fin field effect transistor (FinFET) 32. In an embodiment, the integrated circuit 10 includes several FinFETs. In an embodiment, the integrated circuit 10 includes other types of transistors.

The gate structure 28 of the FinFET 32 is electrically coupled to one of the contacts 34. Similarly, the source/drain regions 30 of the FinFET 32 are electrically coupled to other contacts 34. The contacts 34 are formed from a suitable contact metal such as, for example, tungsten (W).

The contacts 34 are electrically coupled to the interconnect structure 12. In an embodiment, the interconnect structure 12 includes the metal via 36 underlying the metal layer 38. In an embodiment, the metal layer 38 is closer to the substrate 20 than other metal layers (e.g., M2, M3, etc.) in the integrated circuit 10. In an embodiment, both the metal layer 38 and the metal via 36 are formed from the same material such as, for example, copper (Cu) or a copper alloy.

Still referring to FIG. 7, the additional interconnect structure 40 may be formed over and electrically coupled to the interconnect structure 12 and the through via 14. In an embodiment, the second interconnect structure 40 includes the metal via 42 and the metal layer 44. In an embodiment, the through via 14 may extend up to, and be parallel with a top surface of, one of the additional metal layers (e.g., metal layer 44 or a higher metal layer like M3, M4, etc.).

The through via 14 of FIG. 7 extends through the isolation region 22 and at least a portion of the substrate 20. As shown, the through via 14 is level with the top surface 18 of the interconnect structure 12.

Figure 8:
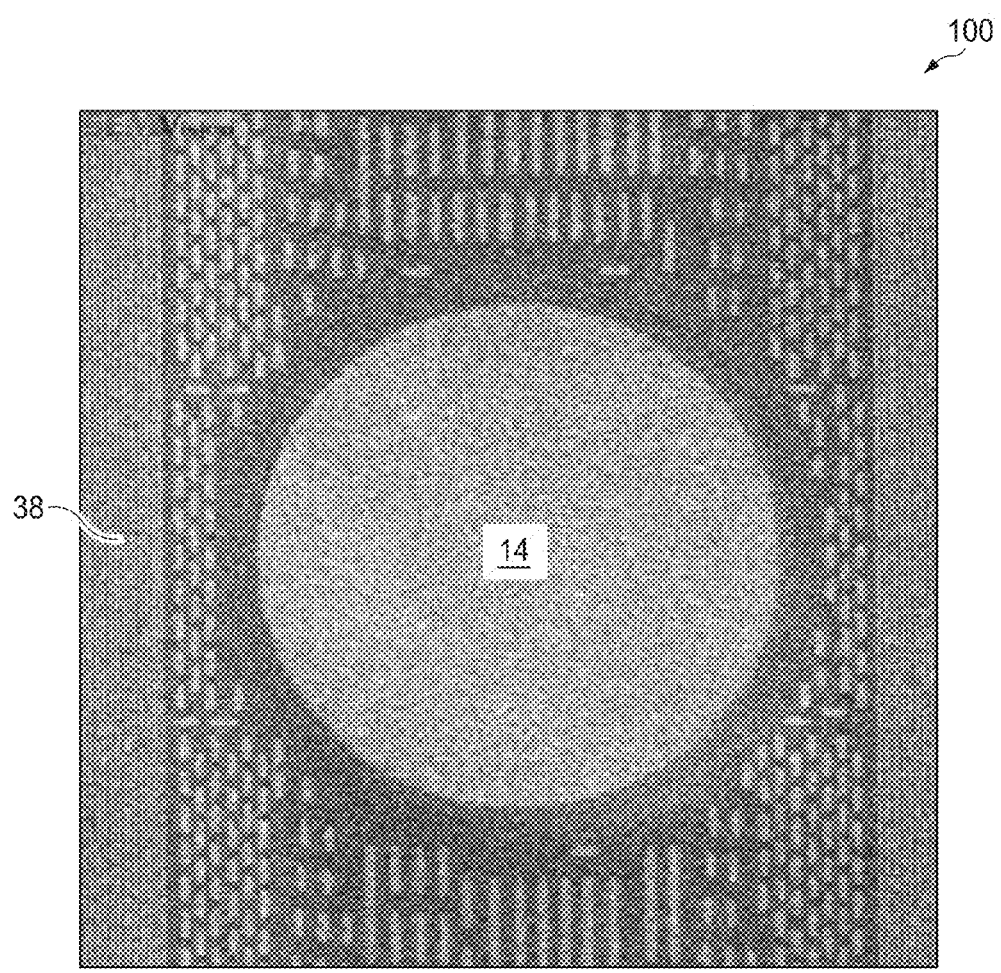
FIG. 8 illustrates a top plan view micrograph image of the through via and a metal layer of the interconnect structure in accordance with some embodiments.

Referring now to FIG. 8, a micrograph top plan view image 100 illustrates the through via 14 and several metal layers 38 of the interconnect structures 12 from within the integrated circuit 10, as described herein. As depicted in the graph 102 of FIG. 9, when characteristics of the metal layers 38 were tested only a very minor resistance (Rs) shift was experienced due to the presence of the through via 12.

Figure 9:
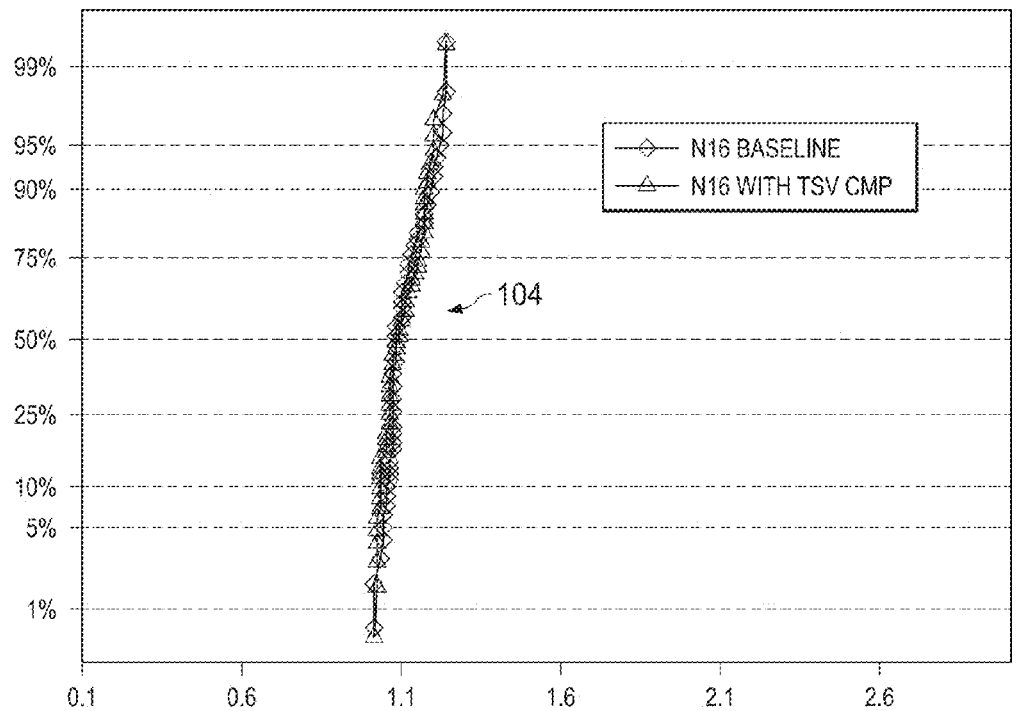
FIG. 9 illustrates a graph of the resistance shift plotted as a function of percentage of units tested (on the vertical axis) relative to the resistance (ohms) per square unit of area (on the horizontal axis).

As shown in FIG. 9, two resistance shifts 104 were plotted as a function of the percentage of units tested (on the vertical axis) and the resistance (in ohms per square unit of area, on the horizontal axis). The results favorably indicated there was a resistance shift of only −0.12% between an N16 baseline structure (without a through via 14 having a top surface co-planar with that of the metal layer) and an N16 structure having the through via 14 described herein. The test was performed using a process control monitor (PCM). The width of the metal layer tested was 0.032 μm and the space between adjacent metal layers was also 0.032 μm. Because the results of the resistance shift test were favorable, the through via 14 described herein can be suitably incorporated in integrated circuits without adversely impacting resistances.

Figure 10:
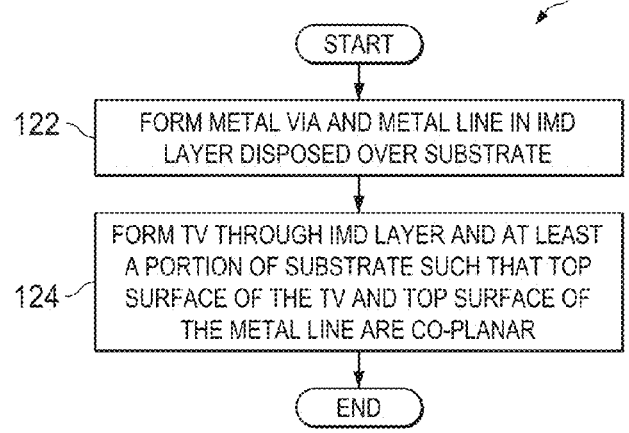
FIG. 10 illustrates a method of forming an integrated circuit in according with some embodiments.

Referring now to FIG. 10, a method 120 of forming an integrated circuit device in accordance with some embodiments is illustrated. In block 122, the metal via 36 and the metal layer 38 are formed in the first intermetal dielectric layer 56 disposed over the substrate 20 using a dual-damascene process. In an embodiment, the metal layer 38 is closer to the substrate 20 than other metal layers (e.g., M2, M3, etc.) disposed over the substrate 20.

After the metal via 36 and the metal layer 38 have been formed in block 122, in block 124 a through via (TV) 14 is formed through the first intermetal dielectric layer 56 and at least a portion of the substrate 20 such that the top surface 16 of the through via 14 is co-planar with the top surface 18 of the metal layer 38.

In accordance with some embodiments, block 124 in FIG. 10 may be performed prior to block 122. In other words, the through via 14 may be formed prior to the metal via 36 and the metal layer 38.

In general terms, the embodiments described herein are intended to provide advanced TV formation processes and a structure suitable for advanced sub-micron technology nodes (e.g., N16 or less). Several advantageous features may result from the above-described structure and processes. One such advantageous feature in the described processes is eliminating or substantially reducing concerns associated with ILD (interlayer dielectric) loss occurring during the TV formation process. For example, the above processes allow for suitable TV formation even when the depth or thickness of the ILD is extremely limited, as in N16 structures or applications. Likewise, loss of the IMD layer, particularly an extreme low k (ELK) IMD layer, can be reduced or eliminated by the above-described processes. For example, the stop layer and/or the cap layer used in the processes may prevent the IMD layer from being damaged. In addition, the structures formed using the above-described processes are robust and reliable.

An embodiment device includes a substrate, an interlevel dielectric layer disposed over the substrate, an intermetal dielectric layer disposed over the interlevel dielectric layer, an interconnect structure extending through the intermetal dielectric layer, and a through via (TV) extending through the intermetal dielectric layer and at least a portion of the substrate. The through via has a top surface co-planar with a top surface of the interconnect structure.

An embodiment device includes a substrate, a fin field effect transistor (FinFET) disposed over the substrate, one or more interlevel dielectric layers disposed over the FinFET, an intermetal dielectric layer disposed over the one or more interlevel dielectric layers, a contact electrically coupled to a gate of the FinFET and extending through at least one of the one or more interlevel dielectric layers, an interconnect structure extending through the intermetal dielectric layer, the interconnect structure electrically coupled to the contact, and a through via (TV) extending through the one or more interlevel dielectric layers and the intermetal dielectric layer. The through via has a top surface co-planar with a top surface of the interconnect structure.

An embodiment method of forming an integrated circuit is provided. The method includes forming a metal via and a metal line in an intermetal dielectric layer disposed over a substrate using a dual-damascene process. The metal line is formed in a metal one layer (M1). The method also includes forming a through via (TV) extending through the intermetal dielectric layer and at least a portion of the substrate. The through via has a top surface co-planar with a top surface of the metal line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, comprising:
forming an intermetal dielectric layer over a substrate;
forming a metal via and a metal line in the intermetal dielectric layer using a dual-damascene process, the metal line formed in a metal one layer (M1);
after forming the intermetal dielectric layer, removing portions of the intermetal dielectric layer to form an opening through the intermetal dielectric layer;
after removing portions of the intermetal dielectric layer, filling the opening with a conductive material to form a through via (TV), the through via extending through the intermetal dielectric layer and at least a portion of the substrate, the through via having a top surface co-planar with a top surface of the metal line; and
after forming the through via, forming one or more dielectric layers over the through via.

2. The method of claim 1, further comprising protecting the intermetal dielectric layer with at least one of a stop layer and a cap layer during formation of the through via.

3. The method of claim 1, wherein the forming the through via is performed prior to the forming the metal via and the metal line.

4. The method of claim 1, further comprising forming a fin field effect transistor (FinFET) over the substrate, a gate of the fin field effect transistor electrically coupled to the metal via.

5. The method of claim 1, wherein the forming the metal via and the metal line is performed prior to the forming the through via.

6. The method of claim 1, further comprising, after forming the metal line and forming the through via, forming a cap layer over the metal line and the through via.

7. The method of claim 6, further comprising forming a stop layer over the cap layer and the intermetal dielectric layer, the one or more dielectric layers being formed over the stop layer.

8. A method of forming an integrated circuit, comprising:
forming a FinFET on a substrate;
forming one or more interlayer dielectric layers over the FinFET;
forming contacts extending through the one or more interlayer dielectric layers to the FinFET;
forming a lowermost intermetal dielectric layer over the one or more interlayer dielectric layers;
forming a first metal layer (M1) in the lowermost intermetal dielectric layer, the first metal layer comprising a first conductive line and a first conductive via, the first conductive line and the first conductive via comprising at least one single continuous conductive element forming both the first conductive line and the first conductive via, the first conductive via extending between the first conductive line to a first contact of the contacts;
after forming the lowermost intermetal dielectric layer, forming an opening that extends through the lowermost intermetal dielectric layer and the one or more interlayer dielectric layers;
after forming the opening, forming a through via in the opening, the through via extending from an upper surface of the lowermost intermetal dielectric layer into the substrate, an upper surface of the first conductive line being level with an upper surface of the through via; and
after forming the through via, forming one or more dielectric layers over the through via.

9. The method of claim 8, further comprising forming an isolation trench in the substrate, wherein the through via extends through the isolation trench.

10. The method of claim 8, wherein forming the first metal layer is performed prior to forming the through via.

11. The method of claim 8, wherein the through via comprises a dielectric liner, a barrier layer, and a first conducive material, wherein forming the through via comprises:
forming the dielectric liner lining sidewalls and a bottom of the opening, the dielectric liner extending along an upper surface of lowermost intermetal dielectric layer;
forming the barrier layer conformally over the dielectric liner; and
filling the opening with the first conductive material.

12. The method of claim 11, further comprising before forming the opening, forming a cap layer and a stop layer different from the cap layer successively over the lowermost intermetal dielectric layer, wherein the opening extends through the cap layer and the stop layer, and wherein after filling the opening with the first conducive material, the cap layer physically contacts the lowermost intermetal dielectric layer, the dielectric liner extends along and physically contacts the stop layer.

13. The method of claim 12, wherein forming the first metal layer is performed after forming the through via, wherein forming the first metal layer comprises:
performing a first planarization process, wherein the first planarization process removes the stop layer and portions of the through via disposed over the cap layer, wherein after the first planarization process, the cap layer and the through via have a coplanar upper surface;
forming a hard mask layer over the cap layer and the through via after the first planarization process;
pattering the hard mask layer to form a trench that extends into the lowermost intermetal dielectric layer, the trench having an upper portion that is wider than a lower portion of the trench;
filling the trench with one or more conductive materials; and
performing a second planarization process, wherein the second planarization process removes the hard mask layer, the cap layer, portions of the one or more conductive material over the lowermost intermetal dielectric layer, and portions of the through via over the lowermost intermetal dielectric layer.

14. The method of claim 8, further comprising:
forming a first etch stop layer between the lowermost intermetal dielectric layer and the one or more interlayer dielectric layers; and
forming a second etch stop layer over the through via and the first metal layer, the one or more dielectric layers being formed over the second etch stop layer.

15. A method of forming an integrated circuit, comprising:
forming an active device on a substrate;
forming one or more interlayer dielectric layers over the active device;
forming a contact extending through the one or more interlayer dielectric layers to the active device;
forming a lowermost intermetal dielectric layer over the one or more interlayer dielectric layers, a lowermost surface of the lowermost intermetal dielectric layer being above an uppermost surface of the interlayer dielectric layers;

using a dual-damascene process to form a conductive line and a conductive via in the lowermost intermetal dielectric layer, the conductive via extending from the conductive line to the contact;

after forming the lowermost intermetal dielectric layer, forming an opening that extends through the lowermost intermetal dielectric layer;

after forming the opening, forming a through via in the opening and extending through the lowermost intermetal dielectric layer into the substrate, the through via comprising a continuous conductive element extending from within the lowermost intermetal dielectric layer into the substrate; and after forming the conductive line and forming the through via, forming a second intermetal dielectric layer over the lowermost intermetal dielectric layer, the second intermetal dielectric layer extending over the through via.

16. The method of claim 15, wherein the active device is a FinFET.

17. The method of claim 15, further comprising forming an isolation trench in the substrate, wherein the through via extends through the isolation trench.

18. The method of claim 15, further comprising planarizing an upper surface of the through via and the conductive line.

19. The method of claim 18, prior to forming the conductive line and the through via, forming a cap layer over the lowermost intermetal dielectric layer, and wherein the planarizing comprises removing the cap layer.

20. The method of claim 15, further comprising:
forming a conductive cap layer over the through via and the conductive line; and
forming a stop layer over the conductive cap layer, the second intermetal dielectric layer being formed over the stop layer.

* * * * *